(12) United States Patent
Nishiwaki et al.

(10) Patent No.: US 9,559,057 B1
(45) Date of Patent: Jan. 31, 2017

(54) SEMICONDUCTOR DEVICE AND METHOD FOR MANUFACTURING THE SAME

(71) Applicant: Kabushiki Kaisha Toshiba, Minato-ku, Tokyo (JP)

(72) Inventors: Tatsuya Nishiwaki, Nonoichi Ishikawa (JP); Masatoshi Arai, Hakusan Ishikawa (JP); Hiroaki Katou, Nonoichi Ishikawa (JP); Hiroaki Katsuda, Kanazawa Ishikawa (JP); Chikako Yoshioka, Kanazawa Ishikawa (JP); Rieko Matoba, Himeji Hyogo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 15/015,550

(22) Filed: Feb. 4, 2016

(30) Foreign Application Priority Data

Aug. 4, 2015 (JP) .................................. 2015-154144

(51) Int. Cl.
*H01L 21/44* (2006.01)
*H01L 23/28* (2006.01)
*H01L 23/528* (2006.01)
*H01L 29/423* (2006.01)
*H01L 21/768* (2006.01)

(52) U.S. Cl.
CPC ....... *H01L 23/528* (2013.01); *H01L 21/76877* (2013.01); *H01L 29/4236* (2013.01)

(58) Field of Classification Search
CPC .................................................. H01L 23/528
USPC .................. 257/767, 773; 438/618, 620, 666
See application file for complete search history.

(56) References Cited

U.S. PATENT DOCUMENTS

| 6,391,721 B2 * | 5/2002 | Nakagawa .......... H01L 21/8247 |
| | | 438/259 |
| 9,219,066 B2 * | 12/2015 | Miyazaki ............ H01L 27/1052 |
| | | 257/315 |
| 2008/0073710 A1 | 3/2008 | Yamamoto |
| 2010/0258863 A1 | 10/2010 | Kaneko |
| 2014/0284708 A1 | 9/2014 | Nishiwaki et al. |
| 2016/0056242 A1 * | 2/2016 | Masuda .............. H01L 29/7813 |
| | | 257/77 |

FOREIGN PATENT DOCUMENTS

JP 2014-033079 A 2/2014

\* cited by examiner

*Primary Examiner* — Calvin Lee
(74) *Attorney, Agent, or Firm* — White & Case LLP (57) ABSTRACT

According to one embodiment, a semiconductor device comprises a first semiconductor region of a first conductivity type, a second semiconductor region of a second conductivity type, a third semiconductor region of the first conductivity type, a gate electrode, a gate interconnect, a second insulating layer, and a first electrode. The first semiconductor region includes a first region and a second region provided around the first region. The gate interconnect is provided on the second region. The gate interconnect includes a first portion and a second portion provided around the second portion. A thickness in the first direction of the second portion is thinner than a thickness in the first direction of the first portion. A length in the second direction of the gate interconnect is longer than a length in the third direction of the gate electrode. The first electrode contacts the gate interconnect.

19 Claims, 11 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2015-154144, filed on Aug. 4, 2015; the entire contents of which are incorporated herein by reference.

FIELD

Embodiments described herein relate generally to a semiconductor device and a method of manufacturing the same.

BACKGROUND

A semiconductor device such as a MOSFET (Metal Oxide Semiconductor Field Effect Transistor), an IGBT (Insulated Gate Bipolar Transistor), or the like may have a trench gate structure in which a gate is formed in the interior of a trench.

In the trench gate structure, there are cases where an interconnect is filled into the outer circumference of the semiconductor device; and the interconnect is connected to gate electrodes and an electrode pad. When the semiconductor device is switched to the ON state, a voltage is applied to the gate electrodes from the electrode pad via the interconnect.

It is desirable for the electrical resistance between the interconnect and the electrode pad to be low.

BRIEF DESCRIPTION OF THE DRAWINGS

FIG. 5A to FIG. 8B are cross-sectional views of processes, showing manufacturing processes of the semiconductor device according to the first embodiment;

DETAILED DESCRIPTION

According to one embodiment, a semiconductor device includes a first semiconductor region of a first conductivity type, a second semiconductor region of a second conductivity type, a third semiconductor region of the first conductivity type, a gate electrode, a gate interconnect, a second insulating layer, and a first electrode. The first semiconductor region includes a first region and a second region. The second region is provided around the first region. The second semiconductor region is provided selectively on the first region. The third semiconductor region is provided selectively on the second semiconductor region. The gate electrode is provided on the first region. The gate electrode extends in a second direction. The gate electrode opposes the second semiconductor region with a first insulating layer interposed in a third direction. The second direction is perpendicular to a first direction from the first region toward the second semiconductor region. The third direction is perpendicular to the first direction and the second direction. The gate interconnect is provided on the second region. The gate interconnect includes a first portion and a second portion. The first portion is provided around the second portion. The first portion extends in the third direction. The second portion extends in the third direction. A thickness in the first direction of the second portion is thinner than a thickness in the first direction of the first portion. The gate interconnect is electrically connected to the gate electrode. A length in the second direction of the gate interconnect is longer than a length in the third direction of the gate electrode. The gate interconnect is surrounded with the first semiconductor region with the first insulating layer interposed. The second insulating layer is provided on the second region. The second insulating layer covers the first portion. The first electrode is provided on the gate interconnect and on the second insulating layer. The first electrode contacts the gate interconnect.

Various Embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

An XYZ orthogonal coordinate system is used in the description of the embodiments. A direction from a first region R1 toward an p-type base region 2 is taken as a Z-direction (a first direction); and two mutually-orthogonal directions perpendicular to the Z-direction are taken as an X-direction (a second direction) and a Y-direction (a third direction).

In the following description, the notations of $n^+$, $n^-$, $p^+$, and $p$ indicate relative levels of the impurity concentrations of the conductivity types. Namely, $n^+$ indicates that the n-type impurity concentration is relatively higher than that of $n^-$, $p^+$ indicates that the p-type impurity concentration is relatively higher than that of $p$.

The embodiments described below may be implemented by reversing the p-type and the n-type of the semiconductor regions.

First Embodiment

An example of a semiconductor device according to a first embodiment will now be described with reference to FIG. 1 to FIG. 4.

Figure 1:
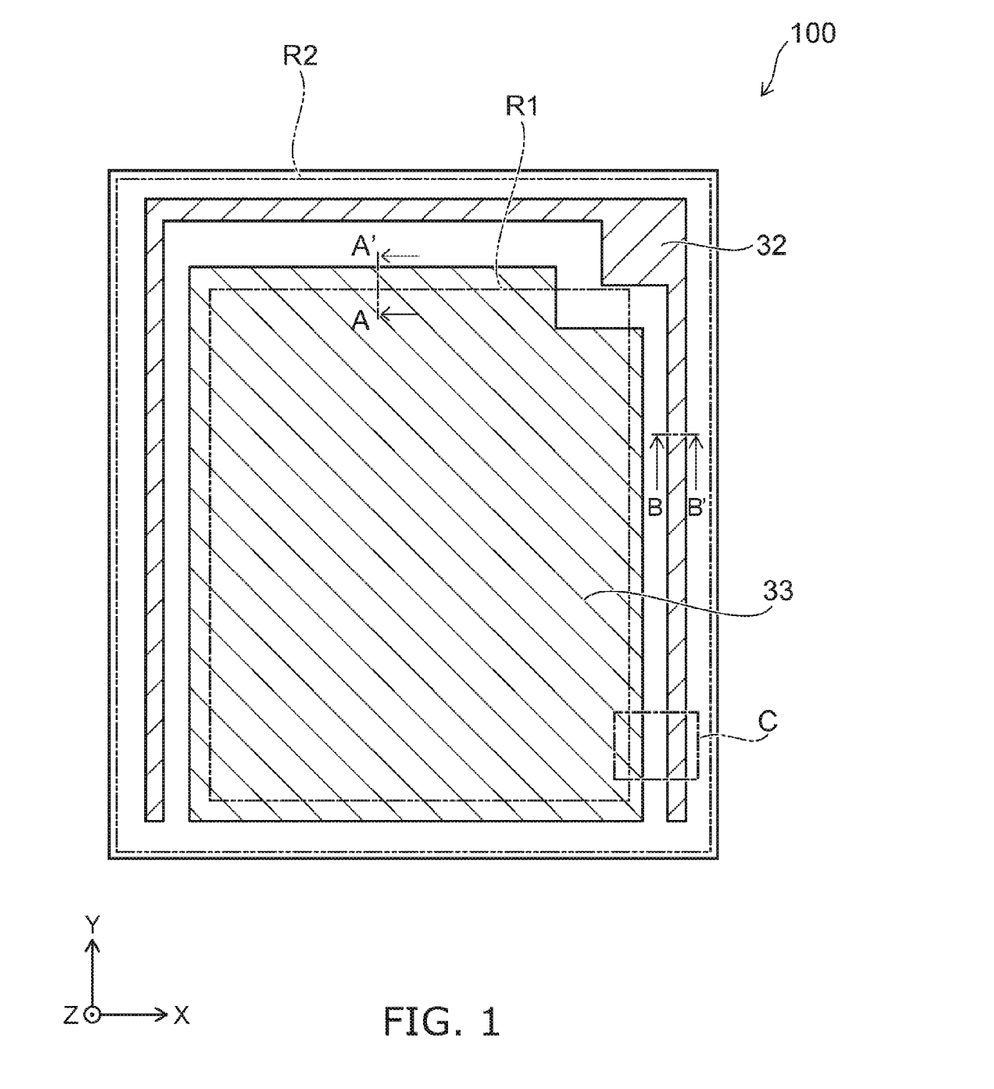
FIG. 1 is a plan view of a semiconductor device according to a first embodiment.

FIG. 1 is a plan view of the semiconductor device 100 according to the first embodiment.

Figure 2:
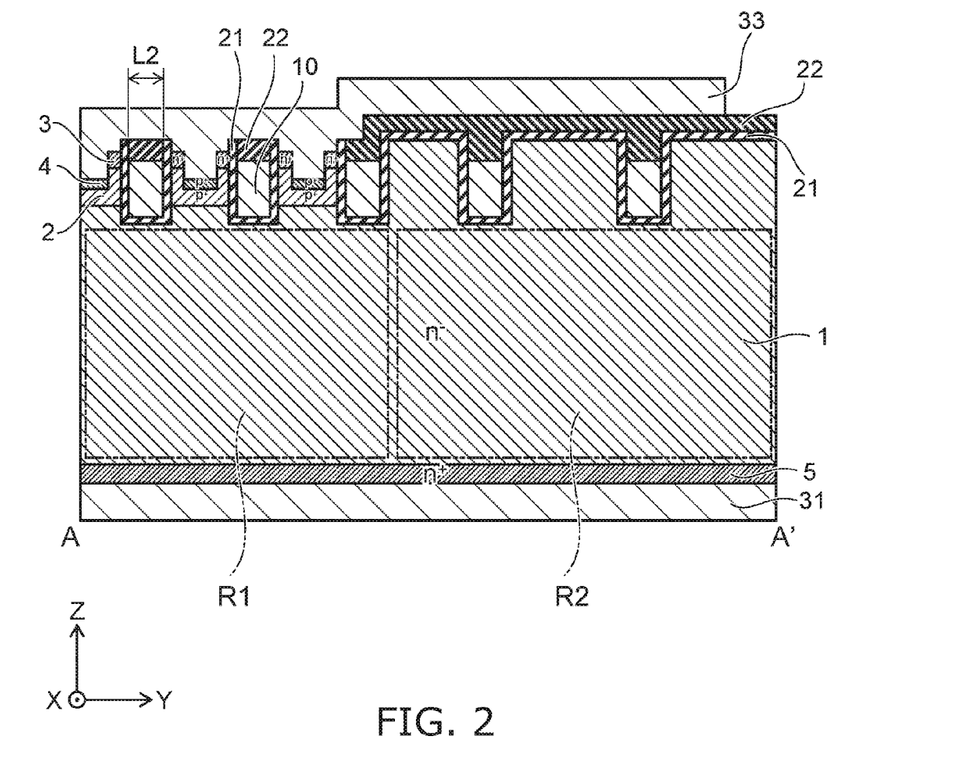
FIG. 2 is an A-A' cross-sectional view of FIG. 1.

FIG. 2 is an A-A' cross-sectional view of FIG. 1.

Figure 3:
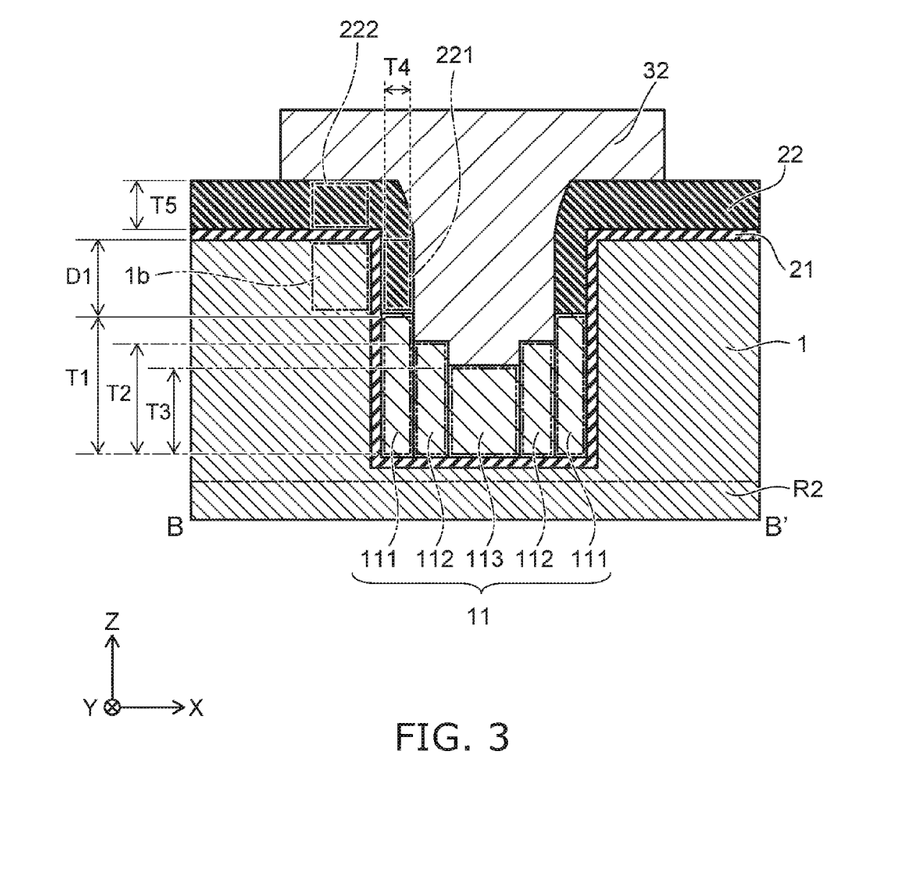
FIG. 3 is a partially enlarged cross-sectional view in which a part of a B-B' cross section of FIG. 1 is enlarged.

FIG. 3 is a partially enlarged cross-sectional view in which a part of a B-B' cross section of FIG. 1 is enlarged.

Figure 4:
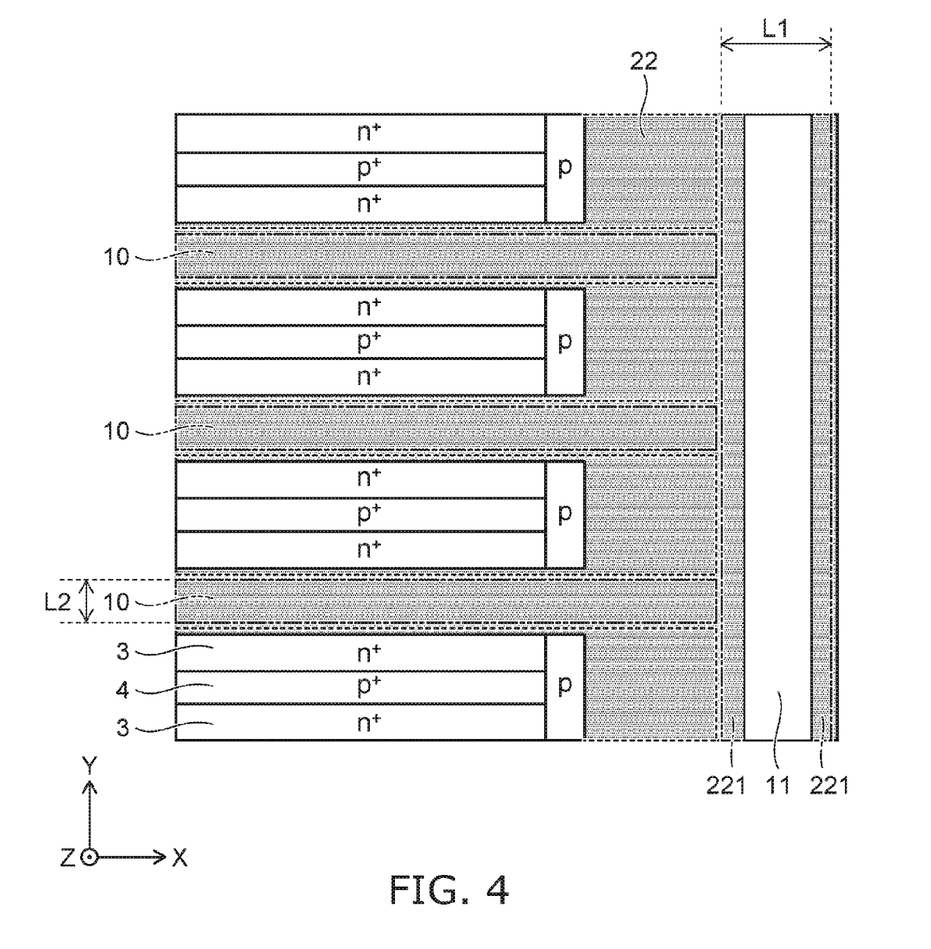
FIG. 4 is a partially enlarged plan view in which portion C of FIG. 1 is enlarged.

FIG. 4 is a partially enlarged plan view in which portion C of FIG. 1 is enlarged.

A first region R1 and a second region R2 that are included in an $n^-$-type semiconductor region 1 are illustrated by broken lines in FIG. 1.

In FIG. 4, a gate electrode pad 32 is not shown; and gate electrodes 10 and a gate interconnect 11 are illustrated by broken lines.

The semiconductor device 100 is, for example, a MOSFET.

As shown in FIG. 1 to FIG. 4, the semiconductor device 100 includes a drain region 5 of an $n^+$-type (a first conductivity type), an $n^-$-type semiconductor region 1 (a first semiconductor region), a base region 2 (a second semiconductor region) of a p-type (a second conductivity type), an $n^+$-type source region 3 (a third semiconductor region), a $p^+$-type contact region 4, a gate electrode 10, a gate interconnect 11, an insulating layer 21 (a first insulating layer), an insulating layer 22 (a second insulating layer), a drain electrode 31, a gate electrode pad 32 (a first electrode), and a source electrode 33 (a second electrode).

As shown in FIG. 1, the second region R2 is provided around the first region R1 along the X-Y plane. At least a part of the source electrode 33 is provided on the first region R1; and at least a part of the gate electrode pad 32 is provided on the second region R2.

A part of the gate electrode pad 32 extends in the X-direction and the Y-direction. The insulating layer 22 is provided between the gate electrode pad 32 and the source electrode 33; and the gate electrode pad 32 and the source electrode 33 are provided to be separated from each other.

As shown in FIG. 2, the drain electrode 31 is provided under the $n^+$-type drain region 5. The drain electrode 31 is electrically connected to the $n^+$-type drain region 5.

The $n^-$-type semiconductor region 1 is provided on the $n^+$-type drain region 5. The $n^-$-type semiconductor region 1 includes the first region R1, and the second region R2 that is provided around the first region R1.

The p-type base region 2 is provided on the first region R1.

The $n^+$-type source region 3 and the $p^+$-type contact region 4 are provided selectively on the p-type base region 2.

The p-type base region 2, the $n^+$-type source region 3, and the $p^+$-type contact region 4 are multiply provided in the Y-direction; and each of these semiconductor regions extends in the X-direction.

The gate electrode 10 is provided on the first region R1. The gate electrode 10 is multiply provided in the Y-direction; and each of the gate electrodes 10 extends in the X-direction. A part of the gate electrode 10 is surrounded with the $n^-$-type semiconductor region 1 along the X-Y plane. In the Y-direction, the gate electrode 10 opposes, with the insulating layer 21 interposed, the p-type base region 2.

The source electrode 33 is provided on the first region R1 and on a part of the second region R2. The source electrode 33 is electrically connected to the $n^+$-type source regions 3 and the $p^+$-type contact regions 4.

The position in the Z-direction of the $p^+$-type contact region 4 is lower than the position in the Z-direction of the $n^+$-type source region 3. Therefore, a part of the source electrode 33 is provided on the $p^+$-type contact region 4 between the $n^+$-type source regions 3.

The insulating layer 22 is provided on the first region R1 and on the second region R2. A part of the insulating layer 22 is provided on the gate electrode 10; and the gate electrode 10 and the source electrode 33 are electrically isolated by the insulating layer 22. The part of the insulating layer 22 is positioned between a part of the insulating layer 21 and one other part of the insulating layer 21 in the Y-direction; and the part of the insulating layer 21 and the one other part of the insulating layer 21 contact the source electrode 33 in the Z-direction. In other words, the part of the insulating layer 21 and the one other part of the insulating layer 21 are provided higher than the $n^+$-type source region 3 in the Z-direction.

As shown in FIG. 3 and FIG. 4, the gate interconnect 11 is provided on the second region R2 and extends in the Y-direction. The gate interconnect 11 is surrounded with the $n^-$-type semiconductor region 1 with the first insulating layer 21 interposed.

The gate interconnect 11 includes a first portion 111, a second portion 112, and a third portion 113. The first to third portions 111 to 113 extend in the Y-direction.

The second portion 112 is surrounded with the first portion 111 along the X-Y plane. A thickness T2 in the Z-direction of the second portion 112 is thinner than a thickness T1 in the Z-direction of the first portion 111.

The third portion 113 is surrounded with the second portion 112 along the X-Y plane. A thickness T3 in the Z-direction of the third portion 113 is thinner than the thickness T2.

The insulating layer 22 covers the first portion 111 of the gate interconnect 11 on the second region R2. The insulating layer 22 includes a first insulating portion 221 and a second insulating portion 222.

The first insulating portion 221 is provided on the first portion 111 and is arranged in the X-direction with a portion 1b of the $n^-$-type semiconductor region 1.

The second insulating portion 222 is arranged in the Z-direction with the portion 1b.

A thickness T4 in the X-direction of the first insulating portion 221 is thinner than a thickness T5 in the Z-direction of the second insulating portion 222. A distance D1 in the Z-direction between the end portion in the Z-direction of the $n^-$-type semiconductor region 1 and the end portion in the Z-direction of the gate interconnect 11 is greater than the thickness T5.

The gate electrode pad 32 is provided on the insulating layer 22 and on the gate interconnect 11. The gate electrode pad 32 is electrically connected to the gate interconnect 11. More specifically, the gate electrode pad 32 contacts the upper surface of the second portion 112 and the upper surface of the third portion 113.

As shown in FIG. 4, the contact surface between the gate interconnect 11 and the gate electrode pad 32 extends in the Y-direction along the gate interconnect 11. The gate interconnect 11 contacts the multiple gate electrodes 10. A length L1 in the X-direction of the gate interconnect 11 is longer than a length L2 in the Y-direction of the gate electrode 10.

Examples of the materials of the components will now be described.

Each of the semiconductor regions includes silicon, silicon carbide, gallium arsenide, or gallium nitride.

The gate electrode 10 and the gate interconnect 11 include polysilicon.

The insulating layers 21 and 22 include silicon oxide.

The drain electrode 31, the gate electrode pad 32, and the source electrode 33 include aluminum.

An example of the method for manufacturing the semiconductor device 100 according to the first embodiment will now be described using FIG. 5A to FIG. 8B.

FIG. 5A to FIG. 8B are cross-sectional views of processes, showing manufacturing processes of the semiconductor device 100 according to the first embodiment. In each of FIG. 5A to FIG. 8B, the drawing on the left side is a cross-sectional view of a process corresponding to the position marked by line A-A' of FIG. 1; and the drawing on the right side is a cross-sectional view of the process corresponding to the position marked by line B-B' of FIG. 1.

Figure 5A:
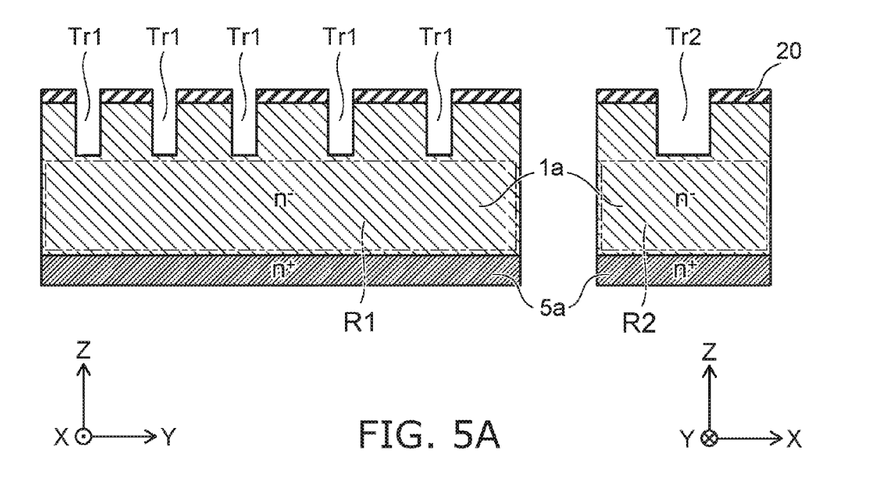

First, a semiconductor substrate in which a semiconductor layer 1a of the n⁻-type is formed on an n⁺-type semiconductor layer 5a is prepared. Continuing, an insulating layer is formed by thermal oxidation of the surface of the n⁻-type semiconductor layer 1a. A mask 20 is formed by patterning the insulating film.

Then, as shown in FIG. 5A, a first trench Tr1 and a second trench Tr2 are made using the mask 20. The first trench Tr1 extends in the X-direction and is multiply made on the first region R1. The second trench Tr2 extends in the X-direction and is made on the second region R2. Parts of the first trenches Tr1 extend to the second region R2; and the second trench Tr2 communicates with the multiple first trenches Tr1 on the second region R2. The first trenches Tr1 and the second trench Tr2 are made so that the width (the length in the Y-direction) of the second trench Tr2 is wider (longer) than the width (the length in the Y-direction) of the first trench Tr1.

Then, thermal oxidation of the inner wall of each trench is performed. An insulating layer 21a is formed of the oxide layer formed at this time and the oxide layer formed previously. Continuing, a conductive layer is formed on the insulating layer 21a. The surface of the conductive layer is caused to recede by etching a part of the conductive layer. By this process, the gate electrodes 10 (first conductive units) are formed in the interiors of the first trenches Tr1; and the gate interconnect 11 (second conductive unit) is formed in the interior of the second trench Tr2.

Figure 5B:
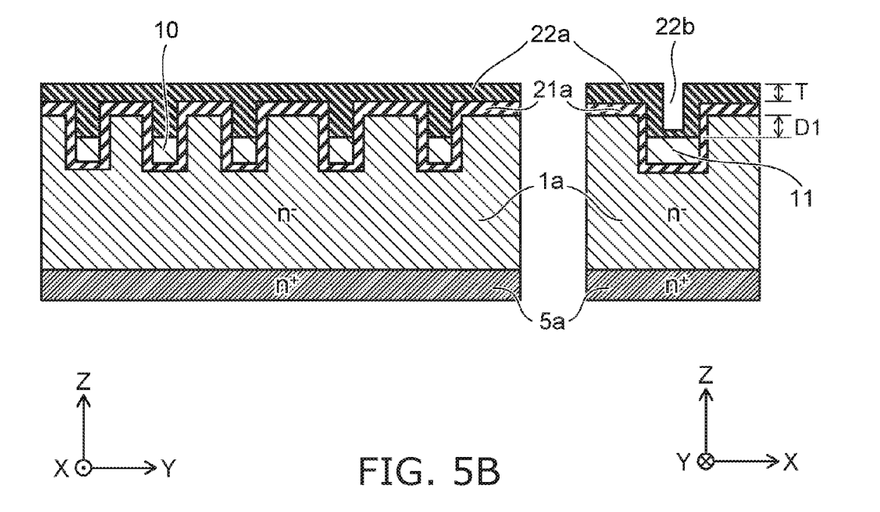

Continuing as shown in FIG. 5B, an insulating layer 22a is formed on the semiconductor layer 1a. The insulating layer 22a is formed so that the first trenches Tr1 are filled with the insulating layer 22a and only a part of the second trench Tr2 is filled with the insulating layer 22a. At this time, a recess 22b is made in the surface of the insulating layer 22a on the gate interconnect 11 because the insulating layer 22a is formed along the upper surface of the gate interconnect 11 and the inner wall of the second trench Tr2.

The gate interconnect 11 and the insulating layer 22a are formed so that the distance D1 in the Z-direction between the upper surface of the n⁻-type semiconductor layer 1a and the end portion in the Z-direction of the gate interconnect 11 is greater than a thickness T in the Z-direction of the insulating layer 22.

Then, a mask 23 is formed on the insulating layer 22a, The mask 23 is provided on the second region R2 and has an opening OP. The length in the X-direction of the opening OP is longer than the length in the X-direction of the recess 22b.

Figure 6A:
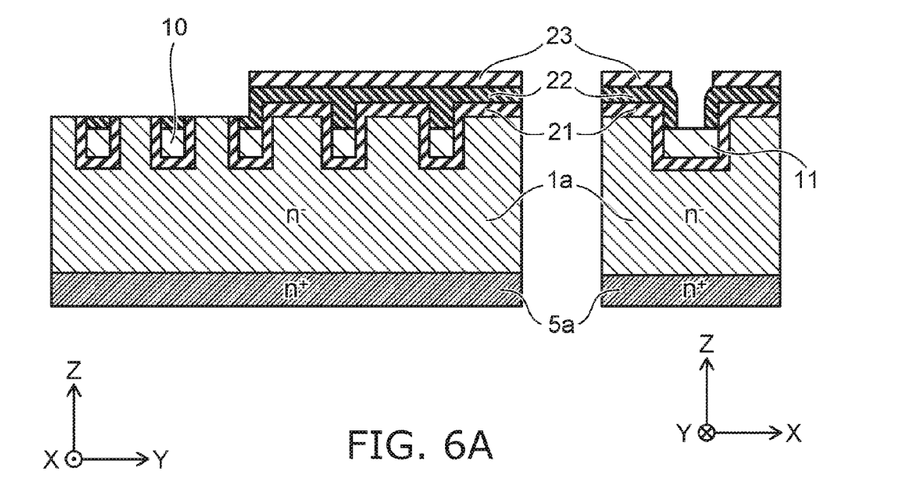

As shown in FIG. 6A, a part of the insulating layer 21a and a part of the insulating layer 22a are removed using the mask 23. By this process, the insulating layers 21a and 22a that are provided on the first region R1 are etched; and the surface of the semiconductor layer 1a is exposed. Simultaneously, the bottom surface of the recess 22b is etched self-aligningly and a part of the surface of the gate interconnect 11 is exposed by using the side wall of the recess 22b on the gate interconnect 11 as a mask.

Then, the mask 23 is removed; and the surface of the semiconductor layer 1a is caused to recede by etching the exposed surface of the semiconductor layer 1a. At this time, a part of the gate interconnect 11 also is etched; and the thickness of the portion of the gate interconnect 11 where the surface is exposed becomes thinner than the thickness of the other portions. Also, the film thickness of the portion of the insulating layer 22 formed along the side wall of the second trench Tr2 becomes thinner than the film thickness of the portion of the insulating layer 22 formed on the upper surface of the insulating layer 21.

Then, the p-type base region 2 and the n⁺-type source region 3 are formed by sequentially ion-implanting a p-type impurity and an n-type impurity into the surface portion of the first region R1. The region of the n⁻-type semiconductor layer 1a other than the p-type base region 2 and the n⁺-type source region 3 corresponds to the n⁻-type semiconductor region 1.

Figure 6B:
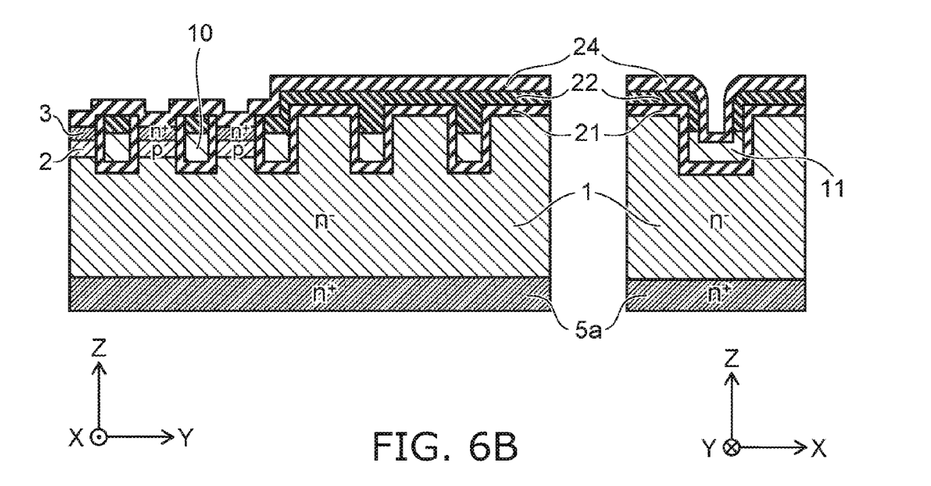

Continuing as shown in FIG. 6B, an insulating layer 24 is formed on the first region R1 and on the second region R2.

Figure 7A:
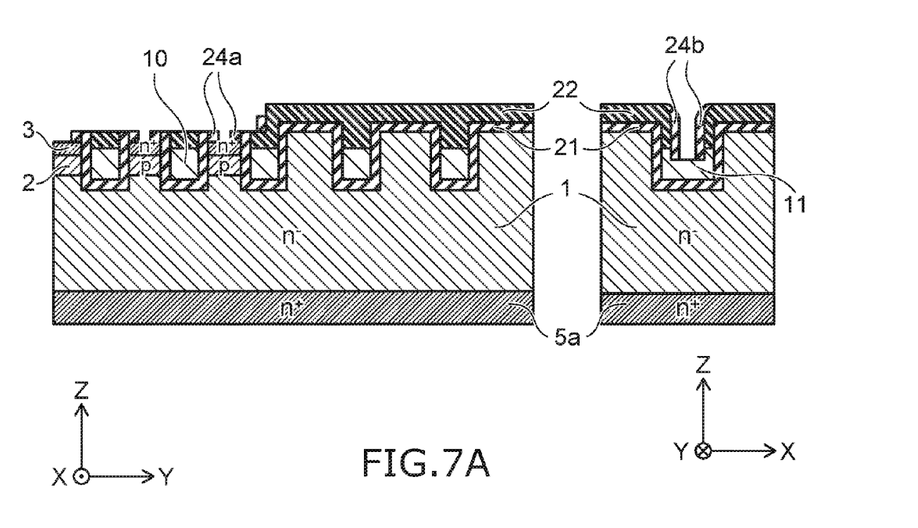

Then, a part of the insulating layer 24 is removed as shown in FIG. 7A. By this process, an insulating layer 24a is formed on the n⁺-type source region 3 along the side wall of the insulating layer 21. Also, an insulating layer 24b is formed on the gate interconnect 11 along the side wall of the insulating layer 22.

Figure 7B:
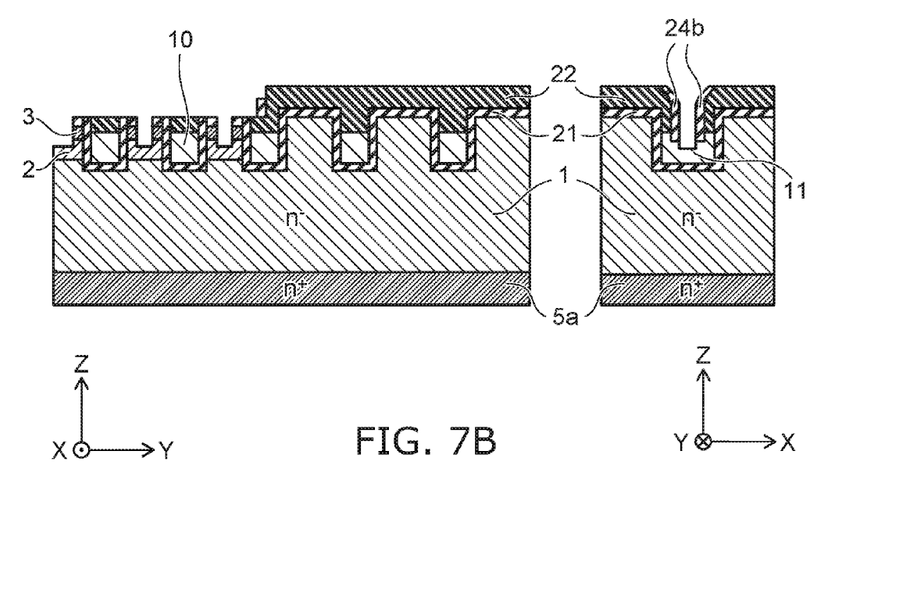

Then, as shown in FIG. 7B, a part of the p-type base region 2 and a part of the n⁺-type source region 3 are etched self-aligningly using the insulating layer 24a as a mask. Simultaneously, a part of the gate interconnect 11 is etched using the insulating layer 24b as a mask.

As a result, the thickness of the portion not covered with the insulating layer 24b is thinner than the thickness of the portion covered with the insulating layer 24b. Also, the thickness of the portion covered with the insulating layer 24b is thinner than the thickness of the portion covered with the insulating layer 22. The portions correspond respectively to the first portion 111, the second portion 112, and the third portion 113 shown in FIG. 3.

Then, the p⁺-type contact region 4 is formed by ion-implanting a p-type impurity into the region of the p-type base region 2 not covered with the insulating layer 24a. Continuing, the insulating layers 24a and 24b are removed.

Figure 8A:
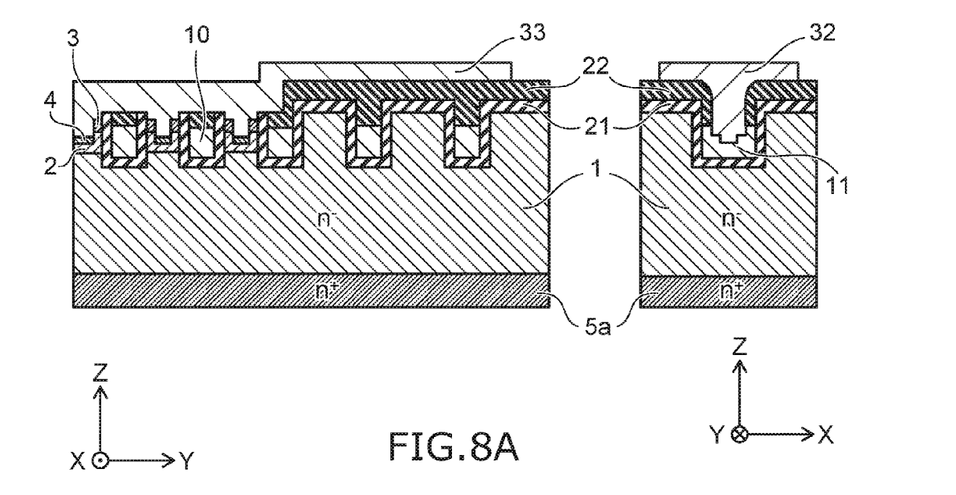

Then, a metal layer is formed on the first region R1 and on the second region R2. At this time, a part of the metal layer is provided on the inner side of the second trench Tr2 and is connected to the gate interconnect 11. As shown in FIG. 8A, the gate electrode pad 32 and the source electrode 33 are formed by patterning the metal layer.

Figure 8B:
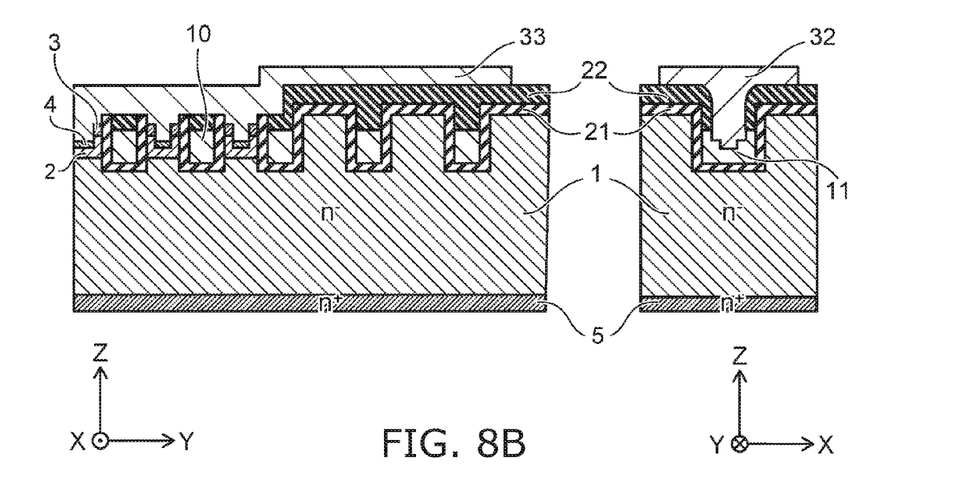

Then, as shown in FIG. 8B, the back surface of the n⁺-type semiconductor layer 5a is polished until the n⁺-type semiconductor layer 5a has a prescribed thickness. The remaining n⁺-type semiconductor layer 5a corresponds to the n⁺-type drain region 5.

Continuing, a metal layer is formed on the back surface of the n⁺-type drain region 5. The semiconductor device 100 shown in FIG. 1 to FIG. 4 is obtained by forming the drain electrode 31 by patterning the metal layer.

Operations and effects according to the embodiment will now be described.

In the semiconductor device according to the embodiment, the length L1 of the gate interconnect 11 is longer than the length L2 of the gate electrode 10. The gate interconnect 11 further includes the first portion 111, and the second portion 112 that is thinner than the first portion 111.

By employing such a configuration, the contact surface area between the gate interconnect 11 and the gate electrode pad 32 can be increased. By increasing the contact surface area between the gate interconnect 11 and the gate electrode pad 32, it is possible to reduce the electrical resistance between the gate interconnect 11 and the gate electrode pad 32.

Because the gate interconnect 11 includes the third portion 113 that is thinner than the second portion 112, it is possible to further increase the contact surface area between the gate interconnect 11 and the gate electrode pad 32 and reduce even further the electrical resistance between the gate interconnect 11 and the gate electrode pad 32.

By setting the thickness T4 of the first insulating portion 221 to be thinner than the thickness T5 of the second insulating portion 222, the contact surface area between the gate interconnect 11 and the gate electrode pad 32 can be increased further. Accordingly, by employing such a configuration, it is possible to reduce even further the electrical resistance between the gate interconnect 11 and the gate electrode pad 32.

According to the embodiment, a part of the gate interconnect 11 is provided between the gate electrode pad 32 and the n⁻-type semiconductor region 1 in the Z-direction. Therefore, the distance between the gate electrode pad 32 that includes a metal material and the n⁻-type semiconductor region 1 that includes a semiconductor material can be increased; and the likelihood of mutual diffusion occurring between the metal material and the semiconductor material can be reduced.

Operations and effects of the method for manufacturing the semiconductor device according to the embodiment will now be described.

According to the manufacturing method according to the embodiment, a part of the insulating layer 22a positioned at the bottom part of the recess 22b is etched self-aligningly using the recess 22b made in the insulating layer 22a; and a part of the surface of the gate interconnect 11 is exposed.

Therefore, shifting of the exposed portion of the gate interconnect 11 can be reduced compared to the case where a mask is formed on the insulating layer 22a using photolithography and the part of the insulating layer 22a is etched using the mask. By reducing the shift, it is possible to suppress the fluctuation of the electrical resistance between the gate interconnect 11 and the gate electrode pad 32 and suppress the fluctuation of the gate leakage current.

It is easy to make the recess 22b by forming the insulating layer 22, the gate interconnect 11, and the second trench Tr2 so that the distance D1 is greater than the thickness T; and the fluctuation of the configuration of the recess 22b can be reduced. Therefore, it is possible to reduce even further the shift of the portion of the gate interconnect 11 exposed by the self-aligning etching using the recess 22b.

Although a MOSFET is used in the description as an example of the semiconductor device according to the embodiment, the invention also is applicable to an IGBT. In the case where the semiconductor device 100 is an IGBT, for example, a p⁺-type semiconductor region is provided between the drain electrode 31 and the n⁺-type drain region 5. In such a case, the drain electrode 31 functions as a collector electrode; and the source electrode 33 functions as an emitter electrode.

Second Embodiment

An example of a semiconductor device according to a second embodiment will now be described with reference to FIG. 9 to FIG. 11.

Figure 9:
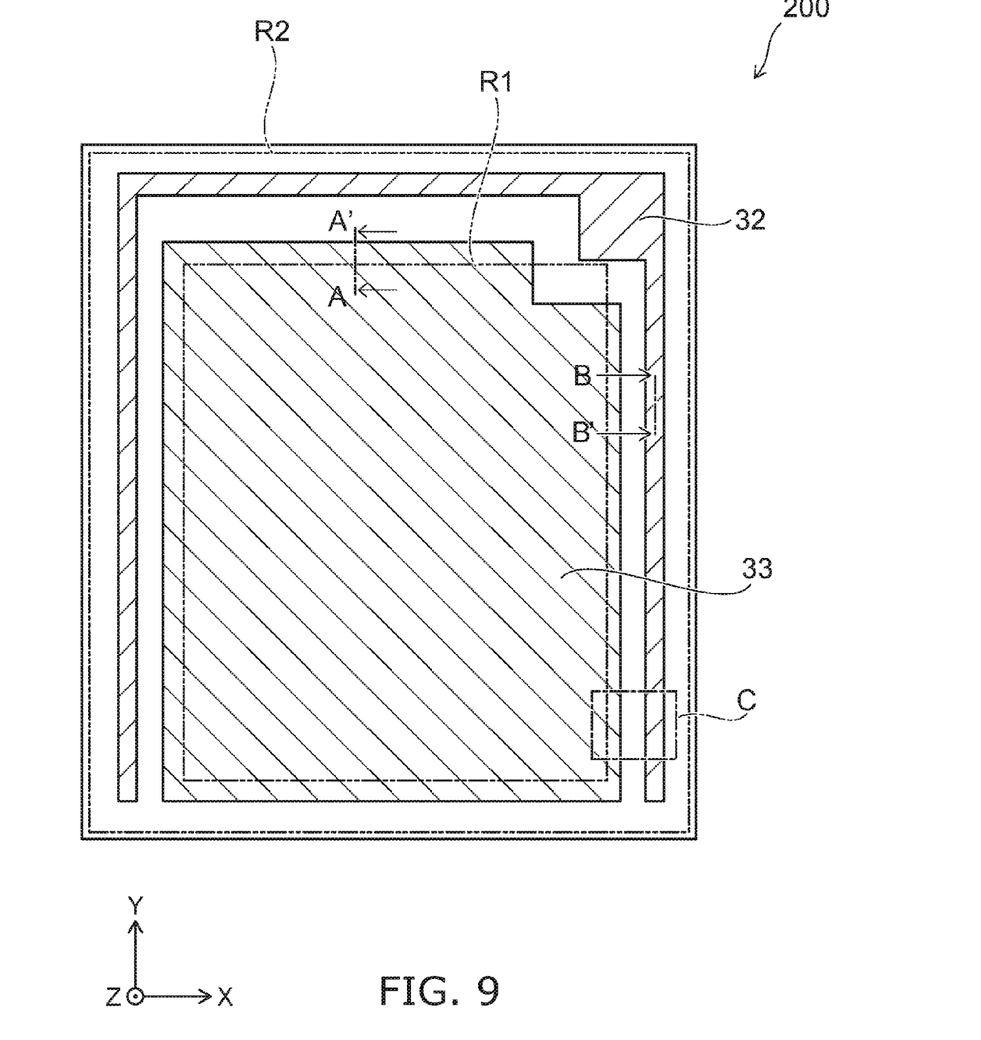
FIG. 9 is a plan view of a semiconductor device according to a second embodiment.

FIG. 9 is a plan view of the semiconductor device 200 according to the second embodiment.

Figure 10:
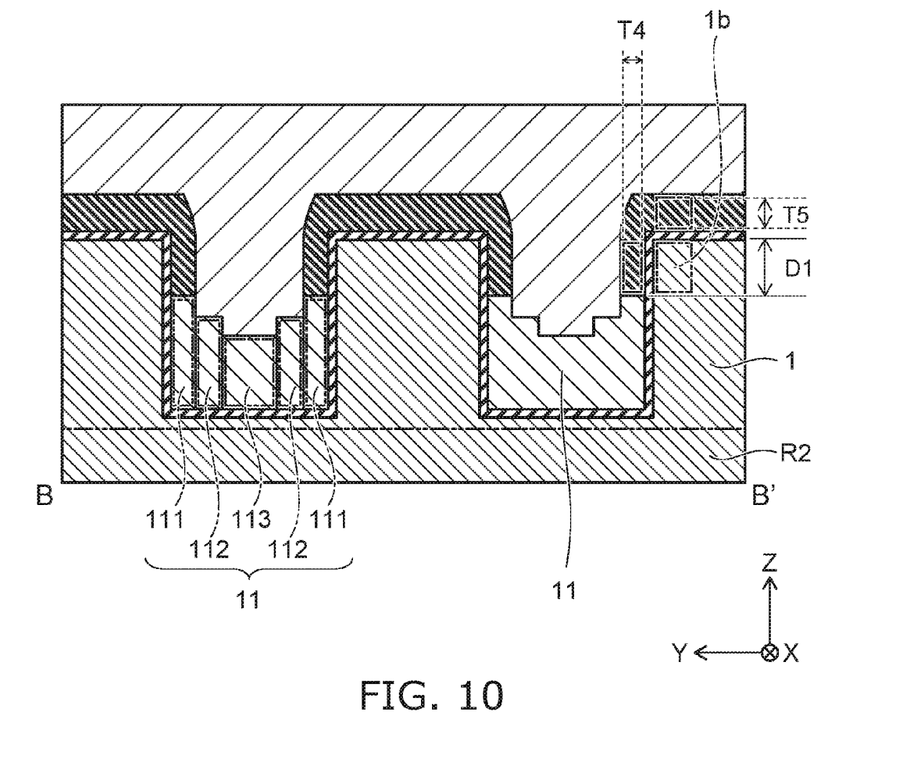
FIG. 10 is a partially enlarged cross-sectional view in which a part of a B-B' cross section of FIG. 9 is enlarged.

FIG. 10 is a partially enlarged cross-sectional view in which a part of a B-B' cross section of FIG. 9 is enlarged.

Figure 11:
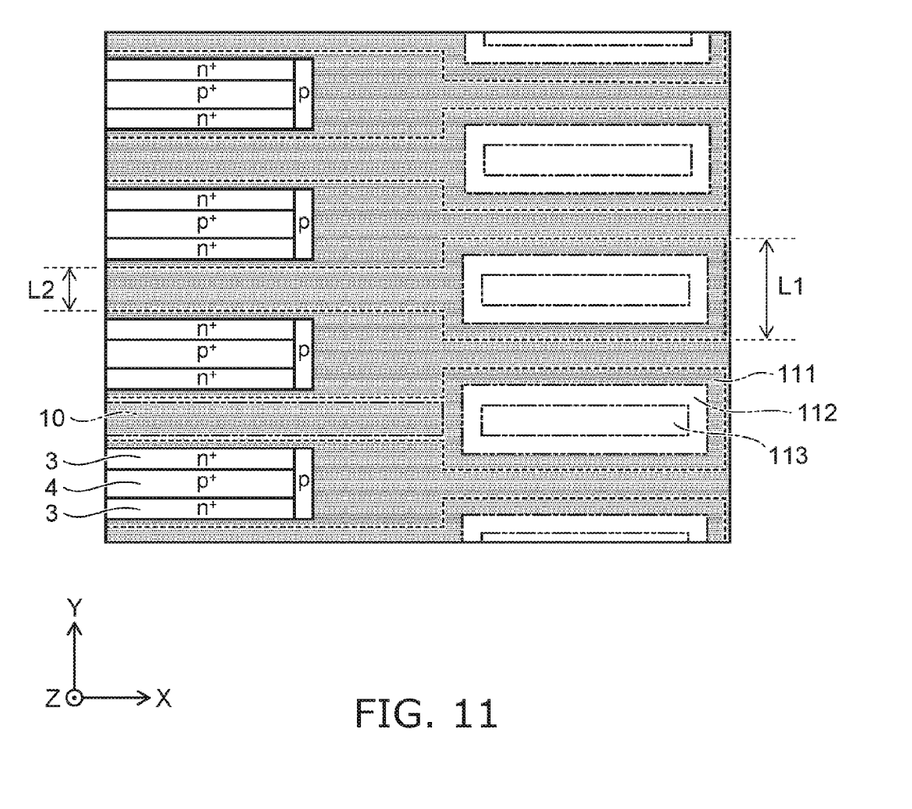
FIG. 11 is a partially enlarged plan view in which portion C of FIG. 9 is enlarged.

FIG. 11 is a partially enlarged plan view in which portion C of FIG. 9 is enlarged.

The first region R1 and the second region R2 that are included in the n⁻-type semiconductor region 1 are illustrated by broken lines in FIG. 9.

In FIG. 11, the gate electrode pad 32 is not shown; and the gate electrode 10 and the gate interconnect 11 are illustrated by broken lines.

The structure of the gate interconnect 11 of the semiconductor device 200 according to the second embodiment is different from that of the semiconductor device 100.

For example, the structure of the A-A' cross section of FIG. 9 is similar to the structure shown in FIG. 2.

As shown in FIG. 10, the gate interconnect 11 is multiply provided in the Y-direction. Each of the gate interconnects 11 includes the first to third portions 111 to 113 that extend in the X-direction. The gate electrode pad 32 extends in the Y-direction on the multiple gate interconnects 11. The gate electrode pad 32 contacts the upper surfaces of the multiple second portions 112 and the upper surfaces of the multiple third portions 113.

As shown in FIG. 11, the gate interconnects 11 are arranged in the X-direction respectively with the gate electrodes 10. The length L1 in the Y-direction of the gate interconnect 11 is longer than the length L2 in the Y-direction of the gate electrode 10.

Similarly to the semiconductor device 100, the thickness T4 is thinner than the thickness T5. The thickness T5 is less than the distance D1.

In the case where the semiconductor device according to the embodiment is made, the first trench Tr1 and the second trench Tr2 are multiply made in the Y-direction in the process shown in FIG. 5A. The second trenches Tr2 communicate respectively with the first trenches Tr1.

It is possible to make the semiconductor device 200 by executing processes similar to the processes shown in FIG. 5B to FIG. 8B after making the first trenches Tr1 and the second trenches Tr2.

In the embodiment as well, similarly to the first embodiment, it is possible to reduce the electrical resistance between the gate interconnect 11 and the gate electrode pad 32.

In the manufacturing method according to the embodiment as well, the shift of the exposed portion of the gate interconnect 11 can be reduced; and as a result, it is possible to suppress the fluctuation of the gate leakage current.

It is possible to confirm the relative levels of the impurity concentrations of the semiconductor regions in the embodiments described above, for example, using a SCM (scanning capacitance microscope). The carrier concentrations of the semiconductor regions may be considered to be equal to the activated impurity concentrations of the semiconductor regions. Accordingly, the relative levels of the carrier concentrations of the semiconductor regions can be confirmed using SCM. It is possible to measure the impurity concentrations of the semiconductor regions, for example, using a SIMS (secondary ion mass spectrometer).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. One skilled in the art can appropriately select specific configurations of components included in the embodiments, for example the n⁺-type drain region 5, the n⁻-type semiconductor region 1, the p-type base region 2, the n⁺-type source region 3, the p⁺-type contact region 4, the gate electrode 10, the drain electrode 31, the gate electrode pad 32, and the source electrode 33 etc., from known art. The accompanying claims and their equivalents are intended to cover such forms or modifications as would fall within the scope and spirit of the invention.

What is claimed is:

1. A method for manufacturing a semiconductor device, comprising:

making a first trench and a second trench in a surface of a first semiconductor region of a first conductivity type, the first semiconductor region including a first region and a second region, the first trench being made in the first region and the second region, the second trench being made in the second region, the first trench and the second trench communicating with each other in the second region, the first trench extending in a second direction, the second trench extending in a third direction, a length in the second direction of the second trench being longer than a length in the third direction of the first trench, the second direction being from the first region toward the second region, the third direction being a direction from the first region toward the second region and perpendicular to the second direction;

forming a first insulating layer along an inner wall of the first trench and an inner wall of the second trench;

forming a first conductive unit on the first insulating layer in a part of the first trench interior;

forming a second conductive unit on the first insulating layer in a part of the second trench interior;

forming a second insulating layer on the first conductive unit and on the second conductive unit, the second insulating layer filling the first trench and filling a part of the second trench; and exposing a part of a surface of the second conductive unit to remove a part of the second insulating layer.

2. The method according to claim 1, wherein the forming of the second insulating layer includes forming the second insulating layer in the interior of the second trench along an upper surface of the second conductive unit and a side wall of the second trench.

3. The method according to claim 1, wherein the exposing of the part of the surface of the second conductive unit includes removing the part of the second insulating layer self-aligningly using, as a mask, a portion of the second insulating layer formed along a side wall of the second trench.

4. The method according to claim 1, wherein the forming of the second insulating layer includes forming the second insulating layer to cover a surface of the first region and a surface of the second region, and the exposing of the part of the surface of the second conductive unit includes exposing at least a part of the surface of the first region by removing the part of the second insulating layer and by removing a part of the first insulating layer and one other part of the second insulating layer.

5. The method according to claim 4, further comprising:

forming a second semiconductor region of a second conductivity type in the surface of the first region, the second semiconductor region opposing the first conductive unit with the first insulating layer interposed; and forming a third semiconductor region of the first conductivity type in a surface of the second semiconductor region.

6. A semiconductor device, comprising:

a first semiconductor region of a first conductivity type including a first region and a second region, the second region being provided around the first region;

a second semiconductor region of a second conductivity type provided selectively on the first region;

a third semiconductor region of the first conductivity type provided selectively on the second semiconductor region;

a gate electrode provided on the first region, the gate electrode extending in a second direction, the gate electrode opposing the second semiconductor region with a first insulating layer interposed in a third direction, the second direction being perpendicular to a first direction from the first region toward the second semiconductor region, the third direction being perpendicular to the first direction and the second direction;

a gate interconnect provided on the second region, the gate interconnect including a first portion and a second portion, the first portion being provided around the second portion, the first portion extending in the third direction, the second portion extending in the third direction, a thickness in the first direction of the second portion being thinner than a thickness in the first direction of the first portion, the gate interconnect being electrically connected to the gate electrode, a length in the second direction of the gate interconnect being longer than a length in the third direction of the gate electrode, the gate interconnect being surrounded with the first semiconductor region with the first insulating layer interposed;

a second insulating layer provided on the second region, the second insulating layer covering the first portion; and a first electrode provided on the gate interconnect and on the second insulating layer, the first electrode contacting the gate interconnect.

7. The device according to claim 6, wherein the gate electrode is multiply provided in the third direction, and the gate interconnect contacts an end portion in the second direction of each of the gate electrodes.

8. The device according to claim 6, wherein the gate interconnect further includes a third portion surrounded with the second portion, and a thickness in the first direction of the third portion is thinner than the thickness in the first direction of the second portion.

9. The device according to claim 6, wherein the second insulating layer includes:

a first insulating portion provided on the second interconnect portion and arranged with a part of the first semiconductor region in the second direction; and a second insulating portion arranged with the part of the first semiconductor region in the first direction, and a distance in the first direction between an end portion in the first direction of the second semiconductor region and an end portion in the first direction of the interconnect unit is greater than a thickness in the first direction of the second insulating portion.

10. The device according to claim 9, wherein a thickness in the second direction of the first insulating portion is thinner than the thickness in the first direction of the second insulating portion.

11. The device according to claim 6, wherein a part of the second insulating layer is provided on the gate electrode.

12. The device according to claim 11, further comprising a second electrode electrically connected to the second semiconductor region and the third semiconductor region and provided to be separated from the first electrode on the second semiconductor region and on the third semiconductor region, the part of the second insulating layer being provided between the gate electrode and the second electrode in the first direction, the part of the second insulating layer being provided between a part of the first insulating layer and one other part of the first insulating layer in the third direction, the part of the first insulating layer and the one other part of the first insulating layer contacting the second electrode in the first direction.

13. A semiconductor device, comprising:

a first semiconductor region of a first conductivity type including a first region and a second region, the second region being provided around the first region;

a second semiconductor region of a second conductivity type provided selectively on the first region;

a third semiconductor region of the first conductivity type provided selectively on the second semiconductor region;

a gate electrode provided on the first region, the gate electrode extending in a second direction, the gate electrode opposing the second semiconductor region with a first insulating layer interposed in a third direction, the second direction being perpendicular to a first direction from the first region toward the second semiconductor region, the third direction being perpendicular to the first direction and the second direction;

a gate interconnect provided on the second region, the gate interconnect including a first portion and a second portion, the first portion being provided around the second portion, the first portion extending in the second direction, the second portion extending in the second direction, a thickness in the first direction of the second portion being thinner than a thickness in the first direction of the first portion, the gate interconnect being electrically connected to the gate electrode, a length in the third direction of the gate interconnect being longer than a length in the third direction of the gate electrode, the gate interconnect being surrounded with the first semiconductor region with the first insulating layer interposed;

a second insulating layer provided on the second region, the second insulating layer covering the first portion; and a first electrode provided on the gate interconnect and on the second insulating layer, the first electrode contacting the first portion.

14. The device according to claim 13, wherein the gate electrode and the gate interconnect are multiply provided in the third direction, the gate interconnects are arranged in the second direction respectively with the gate electrodes, and the first electrode contacts the plurality of gate interconnects.

15. The device according to claim 13, wherein the gate interconnect further includes a third portion surrounded with the second portion, and a thickness in the first direction of the third portion is thinner than the thickness in the first direction of the second portion.

16. The device according to claim 13, wherein the second insulating layer includes:

a first insulating portion provided on the second interconnect portion and arranged with a part of the first semiconductor region in the second direction; and a second insulating portion arranged with the part of the first semiconductor region in the first direction, and a distance in the first direction between an end portion in the first direction of the second semiconductor region and an end portion in the first direction of the interconnect unit is greater than a thickness in the first direction of the second insulating portion.

17. The device according to claim 16, wherein a thickness in the second direction of the first insulating portion is thinner than the thickness in the first direction of the second insulating portion.

18. The device according to claim 13, wherein a part of the second insulating layer is provided on the gate electrode.

19. The device according to claim 18, further comprising a second electrode electrically connected to the second semiconductor region and the third semiconductor region and provided to be separated from the first electrode on the second semiconductor region and on the third semiconductor region, the part of the second insulating layer being provided between the gate electrode and the second electrode in the first direction, the part of the second insulating layer being provided between a part of the first insulating layer and one other part of the first insulating layer in the third direction, the part of the first insulating layer and the one other part of the first insulating layer contacting the second electrode in the first direction.

* * * * *